United States Patent
Liaghati (10) Patent No.: US 9,270,295 B1
(45) Date of Patent: Feb. 23, 2016

(54) LOSSLESS COMPRESSION OF DATA BASED ON A MODIFIED DIFFERENTIAL PULSE CODE MODULATION (DPCM) SCHEME

(71) Applicant: The Boeing Company, Chicago, IL (US)

(72) Inventor: Amir L. Liaghati, Huntsville, AL (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/705,337

(22) Filed: May 6, 2015

(51) Int. Cl.
 *H03M 7/32* (2006.01)
 *H03M 7/30* (2006.01)

(52) U.S. Cl.
 CPC .......... *H03M 7/3051* (2013.01); *H03M 7/3053* (2013.01)

(58) Field of Classification Search
 CPC  H03M 13/2957; H03M 13/41; H03M 7/3082
 USPC .................................. 341/51, 50, 77
 See application file for complete search history.

(56) References Cited

U.S. PATENT DOCUMENTS

| | | | | |
|---|---|---|---|---|
| 5,379,355 A | * | 1/1995 | Allen ...................... | G06T 9/004 375/241 |
| 5,488,419 A | * | 1/1996 | Hui ........................ | H04N 5/145 348/699 |
| 5,748,242 A | * | 5/1998 | Podilchuk ............... | G06T 9/008 348/391.1 |
| 8,497,787 B2 | * | 7/2013 | Yang ..................... | G06F 11/1012 341/51 |

OTHER PUBLICATIONS

Liaghati, Amir L.; "Adaptive Compression of Data"; U.S. Appl. No. 14/609,007, filed Jan. 29, 2015 (34 pages).
Mansour et al.; "Simulation of DPCM and ADM Systems," Computer Modelling and Simulation (UKSim), 2012 UKSim 14th International Conference; pp. 416, 421, Mar. 28-30, 2012 (6 pages).
Simkus et al.. "Ultra-low delay lossy audio coding using DPCM and block companded quantization," 2013 Australian Communications Theory Workshop (AusCTW); pp. 43, 46, Jan. 29-Feb. 1, 2013 (4 pages).

* cited by examiner

*Primary Examiner* — Jean B Jeanglaude
(74) *Attorney, Agent, or Firm* — Baldwin Quan (57) ABSTRACT

A system for decoding data based on a hybrid approach includes a processor and a memory storing instructions that are executable by the processor. The operations include determining a first output based on a magnitude in difference between an initial sample and a previous sample, where the first output includes a first number of bits. The operations also include determining a second output based on a magnitude in difference between the initial sample and a predicted sample, where the second output includes a second number of bits. The operations also include comparing the first output with the second output to determine if the first number of bits is greater than the second number of bits. Finally, the operations include selecting one of the first output and the second output as the final output, wherein selection is based on the final output being expressed in the least number of bits.

20 Claims, 6 Drawing Sheets

LOSSLESS COMPRESSION OF DATA BASED ON A MODIFIED DIFFERENTIAL PULSE CODE MODULATION (DPCM) SCHEME

FIELD

The disclosed system relates to a system and method of decoding data and, more particularly, to a system and method of losslessly compressing data based on either a hybrid differential pulse code modulation (DPCM) scheme or a biased DPCM scheme.

BACKGROUND

Differential pulse code modulation (DPCM) converts an analog signal into a digital signal. Specifically, the analog signal is sampled, and a difference between the actual sampled value and its predicted sample is quantized and then encoded to create a digital value. The predicted sample of the sampled value may be determined based on previous samples of the analog signal. Alternatively, instead of utilizing a predicted sample, the difference may be determined based on the actual sampled value and a previously sampled value. The analog signal may be, for example, data recorded by a sensor. Specifically, data may be collected from various sensors in a system by translating physical data, such as temperature or pressure, into electrical analog signals that represent the physical data.

DPCM is a relatively efficient approach for transmitting data in terms of bandwidth utilization, as only the quantized differences in signal values are encoded and transmitted. DPCM compares two successive analog amplitude values, quantizes and encodes the difference between the analog amplitude values, and transmits the differential value. As it can be assumed that the change, or differential, in the analog signal (i.e., the change in temperature or pressure monitored by the sensor) occurs relatively gradually, sometimes only a few bits may be required to represent each sample. DPCM will work with various numbers of bits such as, for example, a 4-bit approach, an 8-bit approach, or even a 10-bit approach.

SUMMARY

In one aspect, a system for decoding data based on a hybrid approach includes a processor and a memory storing instructions that are executable by the processor. The operations include determining a first output based on a magnitude in difference between an initial sample and a previous sample, where the first output includes a first number of bits. The operations also include determining a second output based on a magnitude in difference between the initial sample and a predicted sample, where the second output includes a second number of bits. The operations also include comparing the first output with the second output to determine if the first number of bits is greater than the second number of bits. Finally, the operations include selecting one of the first output and the second output as the final output, wherein selection is based on the final output being expressed in the least number of bits.

In another aspect, a system for decoding data based on a biased approach includes a processor and a memory storing instructions that are executable by the processor to perform operations. The operations include determining if a final output is expressed as a threshold number of bits. The operations also include determining the final output based on a magnitude in difference between an initial sample and a previous sample in response to the final output being expressed as the threshold number of bits. The operations also include determining the final output based on a magnitude in difference between the initial sample and a predicted sample in response to the final output being expressed as a number of bits that exceed the threshold number of bits.

In yet another aspect, a non-transitory computer readable medium for decoding data based on a hybrid approach is disclosed. The computer readable medium comprises a computer program that when executed by a computer, causes the computer to determine a first output based on a magnitude in difference between an initial sample and a previous sample, where the first output includes a first number of bits. The computer is also caused to determine a second output based on a magnitude in difference between the first sample and a predicted sample, where the second output includes a second number of bits. The computer is also caused to compare the first output with the second output to determine if the first number of bits is greater than the second number of bits. The computer is finally caused to select one of the first output and the second output as the final output, where selection is based on the final output being expressed in the least number of bits.

Other objects and advantages of the disclosed method and system will be apparent from the following description, the accompanying drawings and the appended claims.

DETAILED DESCRIPTION

Figure 1:
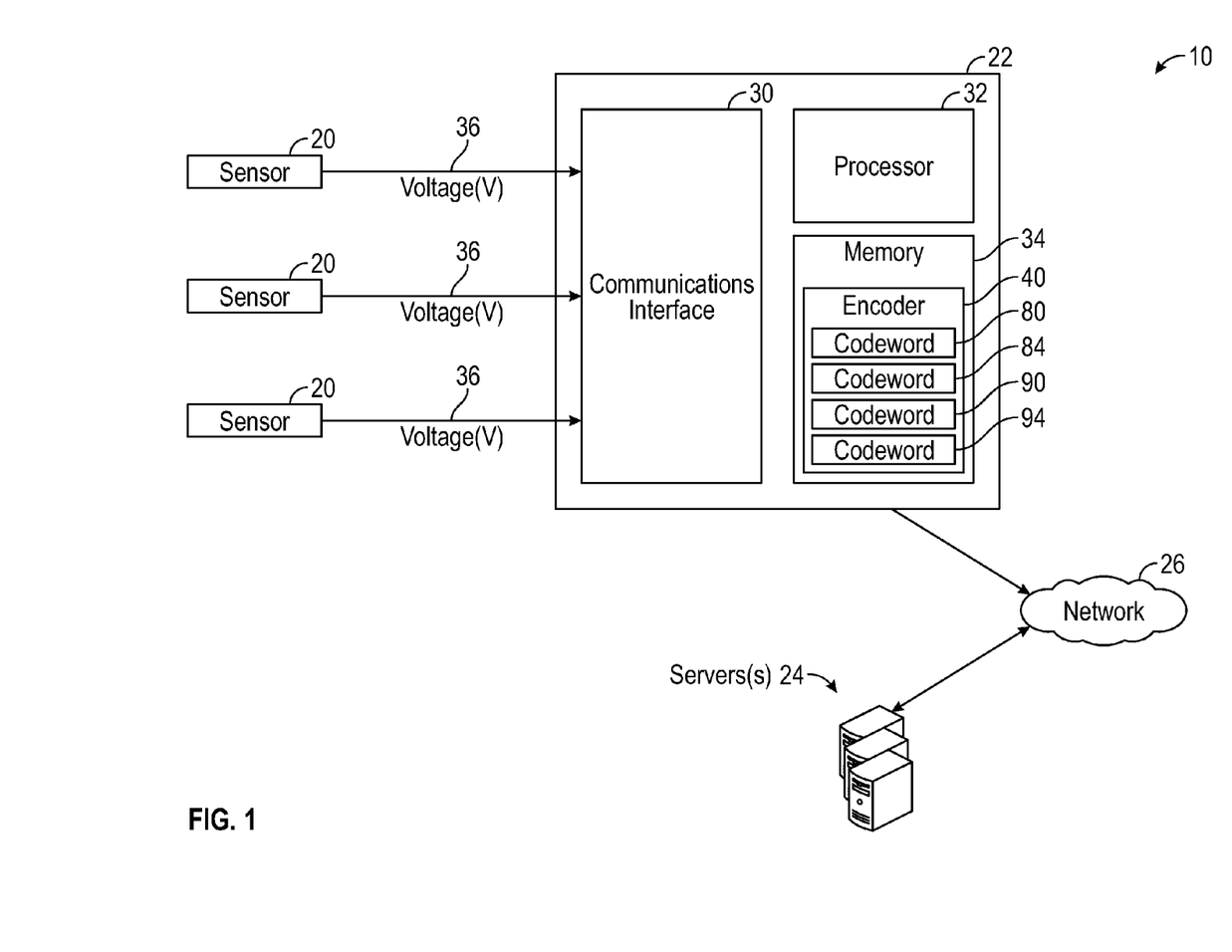
FIG. 1 is an illustration of the disclosed hybrid data encoding system including a plurality of sensors and an electronic device including an encoder.

FIG. 1 illustrates the disclosed hybrid data encoding system 10 according to an aspect of the disclosure. The data encoding system 10 may include one or more sensors 20 in communication with an electronic device 22. The sensors 20 may be any type of transducer for monitoring a characteristic of a system and generating electric signals indicative of the characteristic being monitored. In one embodiment, the sensors 20 may be part of a space launch system, however it is to be understood that the disclosure is not limited to such a system. For example, in another embodiment, the sensors 20 may be associated with another system such as, for example, a refinery, a manufacturing facility, an aircraft, or a satellite. As explained in greater detail below, the hybrid data encoding system 10 may provide an efficient approach for losslessly compressing data recorded by the sensors 20.

The sensors 20 may be used to monitor various characteristics of a system such as, for example, temperature or pressure. The sensors 20 may have a minimum sampling rate of twice the frequency of the monitored signal. The electronic device 22 may be used to communicate data from the sensors 20 to one or more servers 24. In the exemplary embodiment as shown in FIG. 1, the electronic device 22 may communicate with the servers 24 over a network connection 26. For example, the servers 24 may be a terrestrial system for communicating with the sensors 20 of a space launch system.

The electronic device 22 may include a communication interface 30, a processor 32, and memory 34. When the electronic device 22 is in operation, the processor 32 executes instructions stored within the memory 34, to communicate data to and from the memory 34, and to generally control operations of the electronic device 22 pursuant to the instructions. A processor may be any custom made or commercially available processor, a central processing unit (CPU), or generally any device for executing instructions.

The electronic device 22 receives electric signals 36 from the sensors 20 by way of the communication interface 30 at a specific sampling rate. It is to be understood that the electric signals 36 are analog signals such as, for example, voltage values. It is to be understood that the change or differential in the electric signals 36 generated by the sensors 20 may occur relatively gradually, as changes in characteristics such as temperature or pressure do not typically occur instantaneously. An encoder 40 may be saved in the memory 34 of the electronic device 22, and is used to encode the analog electric signals 36 received from the sensors 20 into digital values. Specifically, the encoder 40 may be used to encode the electric signals 36 from the sensors 20 into a number of bits. As explained in greater detail below, the encoder 40 may encode the electric signal into a Y number of bits, which is also referred to as a default number of bits. The encoder 40 may also determine whether to encode the electric signals 36 from the sensors 20 into a different or a reduced number of bits than the default number.

In one embodiment, the default number of bits may be eight. However, as explained in greater detail below, the encoder 40 may be used to decode the electric signals from the sensors 20 into a fewer number of bits than the default value (e.g., a 4-bit value), or, alternatively the encoder 40 may decode the electric signals from the sensors 20 into a greater number of bits than the default value (e.g., a 10-bit value). It is to be understood that while 4-bit, 8-bit, and 10-bit values are described in the present application, the disclosure is not limited to these examples. Indeed, those of ordinary skill in the art will readily appreciate the electric signals 36 from the sensors 20 may be encoded into any number of bits. For example, in another embodiment, the electric signals 36 may be encoded into either a 6-bit, 9-bit, or an 11-bit value, where the 9-bit value is the default number of bits. The encoded value may then be stored within the memory 34 of the electronic device 22. Additionally or alternatively, the encoded values may be sent to the server 24.

Figure 2:
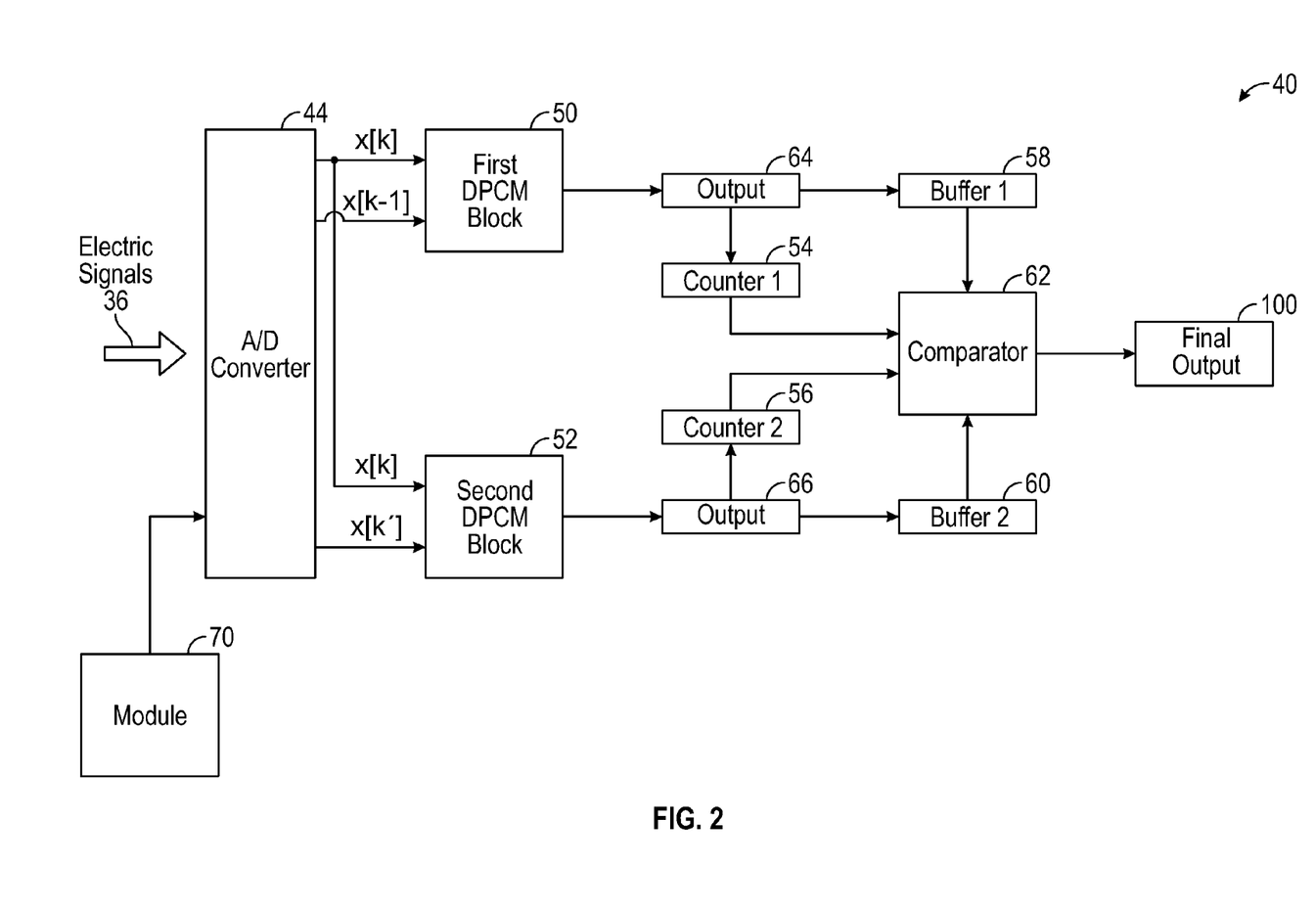
FIG. 2 is a block diagram of the encoder shown in FIG. 1 based on a hybrid approach, where the encoder includes a first differential pulse code modulation (DPCM) block and a second DPCM block.

FIG. 2 is a block diagram of an exemplary encoder 40 for encoding the electric signals 36 from the sensors 20 based on a hybrid approach. The encoder 40 receives as input the electric signals 36 from the sensors 20 (FIG. 1). The encoder may 40 may first quantize the electric signals 36 from the sensors 20 into a specific number of bits using an analog to digital (A/D) converter 44. For example, in one embodiment, the A/D converter 44 may quantize the analog signal 36 into a 12-bit value, however it is to be understood that this bit value is merely exemplary in nature. Specifically, the encoder 40 receives an analog sample from one of the sensors 20. The analog sample may be a voltage value that corresponds with a sampled temperature or pressure. The A/D converter 44 may then quantize the analog sample into a digital signal that is expressed in a number of bits. The quantized value is represented as an initial sample $x[k]$. In one embodiment, the initial sample $x[k]$ is a 12-bit digital representation of the electric signal 36.

The encoder 40 also includes a first differential pulse code modulation (DPCM) block 50, a second DPCM block 52, a first counter 54, a second counter 56, a first buffer 58, a second buffer 60, and a comparator 62. The first DPCM block 50 and the second DPCM block 52 both receive as input the initial sample $x[k]$. The first DPCM block 50 determines a first output 64 based on a magnitude in difference between the initial sample $x[k]$ and a previous sample $x[k-1]$. The previous sample $x[k-1]$ represents an electric signal 36 that was quantized by the A/D converter 44 previous to the initial sample $x[k]$. The second DPCM block 52 determines a second output 66 based on a magnitude in difference between the initial sample $x[k]$ and a predicted sample $x[k']$.

The predicted sample $x[k']$ may be generated by a module 70 that is part of the processor 32 of the electronic device 22 (FIG. 1). In an alternative embodiment, the module 70 may be a separate component from the processor 32. The predicted sample $x[k']$ may be determined based on previous data generated by the sensors 20 that is collected by the hybrid data encoding system 10 (FIG. 1). In the embodiment as shown in FIG. 2, the module 70 generates analog values that are quantized by the A/D converter 44 into the predicted sample $x[k']$. However, it is to be appreciated that in an alternative embodiment the module 70 may generate digital values that are sent directly to the second DPCM block 52. The predicted sample $x[k']$ may be quantized independently from the initial sample $x[k]$, however the same approach for quantizing the initial sample $x[k]$ may also be used for the predicted sample $x[k']$.

The comparator 62 includes control logic for comparing the number of bits of a first output 64 determined by the first DPCM block 50 with the number of bits of a second output 66 determined by the second DPCM block 52. The comparator 62 also includes control logic for determining if the first output 64 includes a greater number of bits than the second output 66 of the second DPCM block 52. The comparator 62 then selects the output 64, 66 having the least number of bits. In other words, the comparator 62 selects the output 64, 66 having the shortest digital length. It is to be understood that selecting the output 64, 66 requiring the fewest number of bits results in a greater compression of data, and also reduces the bit error rate.

Figure 3:
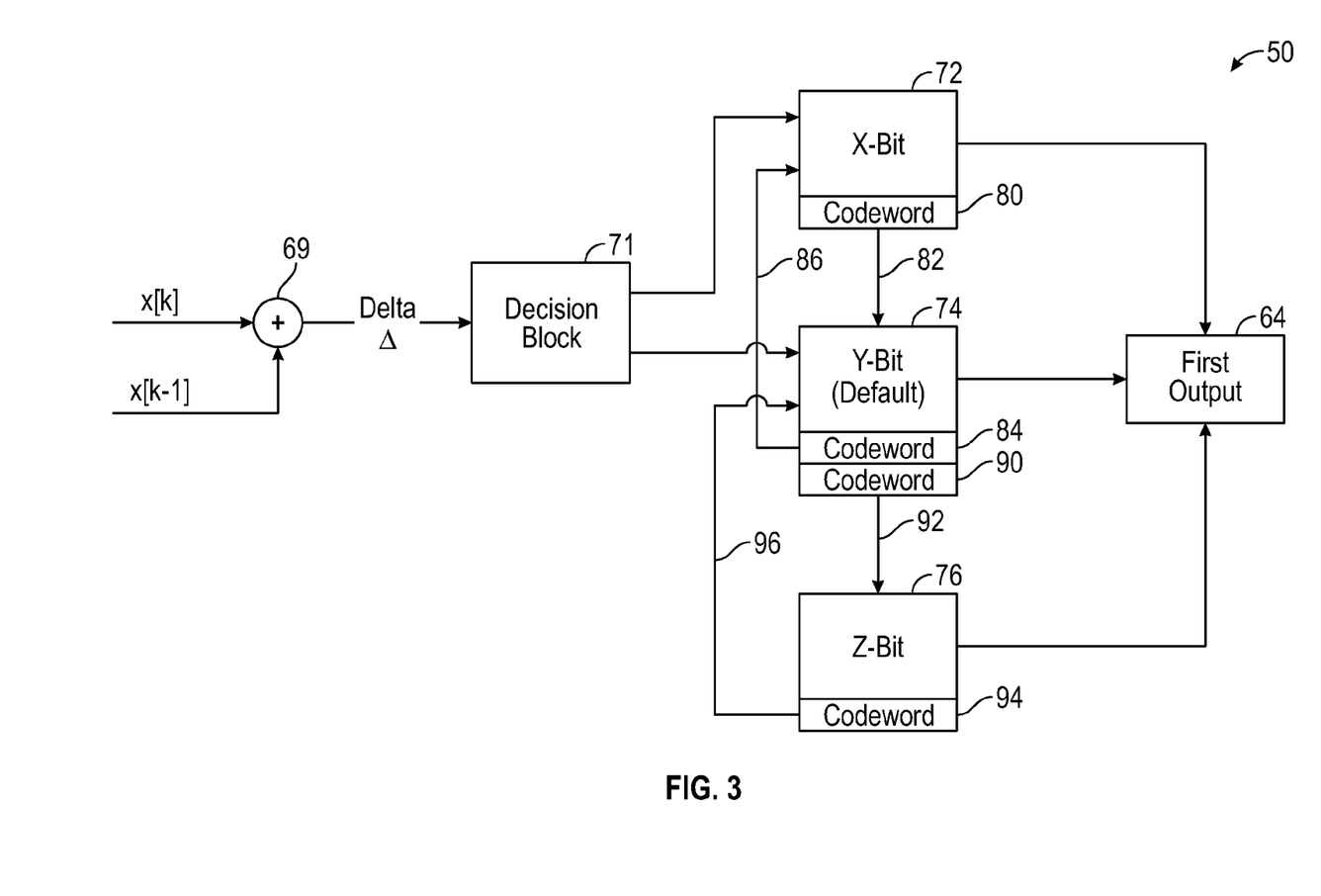
FIG. 3 is a block diagram of the first DPCM block shown in FIG. 2.

FIG. 3 is a block diagram illustrating the first DPCM block 50. The first DPCM block 50 includes a subtraction block 69, a decision block 71, an X-bit block 72, a Y-bit block 74, and a Z-bit block 76. The Y-bit block 74 may represent a default number of bits. For example, in one embodiment, the Y-bit block 74 represents 8-bit values. The X-bit block 72 may represent a bit value that is less than the default number of bits such as, for example, 4-bit values. The Z-bit block 76 may represent a bit value that is greater than the default number of bits such as, for example, 10-bit values.

The subtraction block 69 receives as input the initial sample $x[k]$ and the previous sample $x[k-1]$ from the A/D converter 44 (FIG. 2). The subtraction block 69 may then determine a difference or delta $\Delta$ between the initial sample $x[k]$ and the previous sample $x[k-1]$. It is to be understood that the delta $\Delta$ may be a digital value including a fixed or predefined number of bits. For example, in one embodiment, the delta $\Delta$ is expressed as a 12 bit-value. The delta $\Delta$ value is then sent to the decision block 71.

The decision block 71 may then determine if the delta $\Delta$ should be expressed in the default number of bits (e.g., an 8-bit value), as a number of bits less than the default value (e.g., a 4-bit value), or as a number of bits greater than the default value (e.g., a 10-bit value). For example, the decision block 71 may determine if the delta Δ may be expressed as a 4-bit value ranging between −8 and +7, an 8-bit value ranging from −128 to +127, or a 10-bit value ranging from −512 to +511 during operation of the encoder 40. Those of ordinary skill in the art will readily appreciate that while 4-bit, 8-bit, and 10-bits values are described, the disclosure is not limited to the present example.

During initial operation of the encoder 40, a first delta Δ1 may first be received by decision block 71. The first delta Δ1 represents an initial or first difference determined by the subtraction block 69. The first delta Δ1 may be a digital 12-bit value including a flag bit. The flag bit provides an indication as to whether the first delta Δ1 is expressed in Y-bits, X-bits (i.e., the default value), or Z-bits. If the flag bit indicates the first delta Δ1 is expressed in an X number of bits, then the first delta Δ1 is sent to the X-bit block 72. The first delta Δ1 may then be expressed as the first output 64. Alternatively, if the flag bit indicates the first delta Δ1 is expressed in Y number of bits, then the first delta Δ1 is sent to the Y-bit block 74. The first delta Δ1 may then be expressed as the first output 64. However, if the first delta Δ1 is expressed in Z number of bits, then the first delta Δ1 may be expressed as a fourth codeword 94, which is explained in greater detail below.

During operation of the encoder 40, the first DPCM block 50 may determine that the delta Δ may no longer be expressed in the current number of bits. For example, the flag bit may indicate that the first delta Δ1 may be expressed in an X bits (e.g., 4 bits). However, during subsequent operation the encoder 40, the value of delta Δ may change such that the value of delta Δ needs to be expressed in a greater number of bits than X. Specifically, a second delta Δ2, which is generated subsequent to the first delta Δ1, may represent a numerical value that exceeds the range of X bits. For example, the second delta Δ2 may be a numerical value that exceeds 4 bits (i.e., exceeds the range of −8 and +7). In response to determining that the second delta Δ2 represents a numerical value that exceeds 4 bits, the decision block 71 may then generate a first indicator or codeword 80. The first codeword 80 may be saved within the memory 34 of the electronic device 22 (FIG. 1). The first codeword 80 provides an indication to the decision block 71 that the second delta Δ2 should be expressed as a different binary value than the first delta Δ1. Specifically, the first codeword 80 indicates that the second delta Δ2 should be expressed as a Y-bit value (e.g., an 8-bit value).

Based on the exemplary encoded scheme as described, the X-bit block 72 may represent a 4-bit block, and the first codeword 80 may be a binary value expressing the values −6, −7, or 7. It is to be understood that the decision block 71 does not provide the value of the first codeword 80 to the X-bit block 72, thus allowing either −6, −7, or 7 to be used as the first codeword 80. For example, in 2's complement the value −6 may be expressed as 1010, the value −7 may be expressed as 1001, and the value 7 may be expressed as 0111. In this example, the first codeword 80 indicates that the second delta Δ2 should be expressed as an 8-bit value. Thus, a signal or indicator 82 is sent to the Y-bit block 74 by the X-bit block 72 containing the second delta Δ2. The second delta Δ2 may then be transmitted as the first output 64 of the first DPCM block 50 as a Y-bit value by the Y-bit block 74.

Continuing to refer to FIG. 3, during operation of the encoder 40 the first DPCM block 50 may determine that the delta Δ may no longer be expressed in Y bits. Specifically, in one approach a third delta Δ3, which is generated subsequent to the second delta Δ2, may represent a numerical value that may be expressed in a fewer number of bits than the default value of Y bits. For example, the third delta Δ3 may be a numerical value that may actually be expressed in only X number of bits (e.g., the third delta Δ3 may be expressed as a 4-bit value instead of the default 8-bit value). In response to determining that the third delta Δ3 represents a numerical value that may be expressed in a fewer number of bits than the default value of Y bits, the decision block 71 may then generate a second indicator or codeword 84. The second codeword 84 may be saved within the memory 34 of the electronic device 22 (FIG. 1). The second codeword 84 provides a signal or indicates that the third delta Δ3 should be expressed as an X-bit value.

Based on the exemplary encoded scheme as described above, in one embodiment the second codeword 84 of the Y-bit block 74 may be a binary value expressing the value −128. It is to be understood that the decision block 71 does not provide this value to the Y-bit block 74, thus allowing −128 to be used as the second codeword 84. For example, in 2's complement the value −128 may be expressed as the value 10000000. In this example, the second codeword 84 indicates that the third delta Δ3 should be expressed as an X-bit value. Thus, a signal or indicator 86 is sent to the X-bit block 72 by the Y-bit block 74 containing the third delta Δ3. The third delta Δ3 may be transmitted as the first output 64 of the first DPCM block 50 as an X-bit value by the X-bit block 72.

In addition to the second codeword 84, a third codeword 90 may also be saved within the memory 34 of the electronic device 22 (FIG. 1). The third codeword 90 may be used in an alternative approach where the third delta Δ3 represents a numerical value expressed in a greater number of bits than the default value. In other words, the third codeword 90 may be used if the third delta Δ3 should be expressed as a 10-bit value, while the second codeword 84 should be used if the third delta Δ3 may be expressed as a 4-bit value. In response to determining that the third delta Δ3 represents a numerical value that may be expressed in a greater number of bits than the default value, the decision block 71 may then generate the third codeword 90. The third codeword 90 indicates that third delta Δ3 should be expressed as a Z-bit value.

In one exemplary embodiment, the third codeword 90 may be the value −128 or +127. It is to be understood that the decision block 71 does not provide these values to the Y-bit block 74, thus allowing −127 or 127 to be used as the third codeword 90. For example, in 2's complement the value −128 may be expressed as 10000000, and the value 127 may be expressed as 01111111. In this example, the third codeword 90 indicates that the third delta Δ3 should be expressed as a Z-bit value. Thus, a signal or indicator 92 is sent to the Z-bit block 76 by the Y-bit block 74 containing the third delta Δ3. The third delta Δ3 may then be transmitted as the first output 64 of the first DPCM block 50 as a Z-bit value by the Z-bit block 76.

Continuing to refer to FIG. 3, during subsequent operation of the encoder 40, the delta Δ may no longer be expressed in Z bits. Specifically, in one approach a fourth delta Δ4, which is generated subsequent to the third delta Δ3, may represent a numerical value that may be expressed in a fewer number of bits than Z. For example, the fourth delta Δ4 may be a numerical value that may actually be expressed in only Y number of bits (i.e., the fourth delta Δ4 may be within the range of a 8-bit value). In response to determining that the fourth delta Δ4 represents a numerical value that may be expressed in a fewer number of bits than Z number of bits, the decision block 71 may then generate the fourth codeword 94. The fourth codeword 94 may be saved within the memory 34 of the electronic device 22 (FIG. 1). The fourth codeword 94 provides a signal or indicates that the fourth delta Δ4 should be expressed as a different binary value. Specifically, the codeword 94 indicates that fourth delta Δ4 should be expressed as an X-bit value.

Based on the exemplary encoded scheme as described above, in one embodiment the fourth codeword 94 may be the values −512 to +511. It is to be understood that the decision block 71 does not provide this value to the Z-bit block 76, thus allowing −512 to +511 to be used as the fourth codeword 94. For example, in 2's complement the value −512 may be expressed as the value 1000000000, and the value +511 may be expressed as 0111111111. In this example, the fourth codeword 94 indicates that the fourth delta Δ4 should be expressed as an Y-bit value. Thus, a signal or indicator 96 is sent to the Y-bit block 74 by the Z-bit block 76 containing the fourth delta Δ4. The fourth delta Δ4 may be transmitted as the first output 64 of the first DPCM block 50 as a Y-bit value by the Y-bit block 74.

Figure 4:
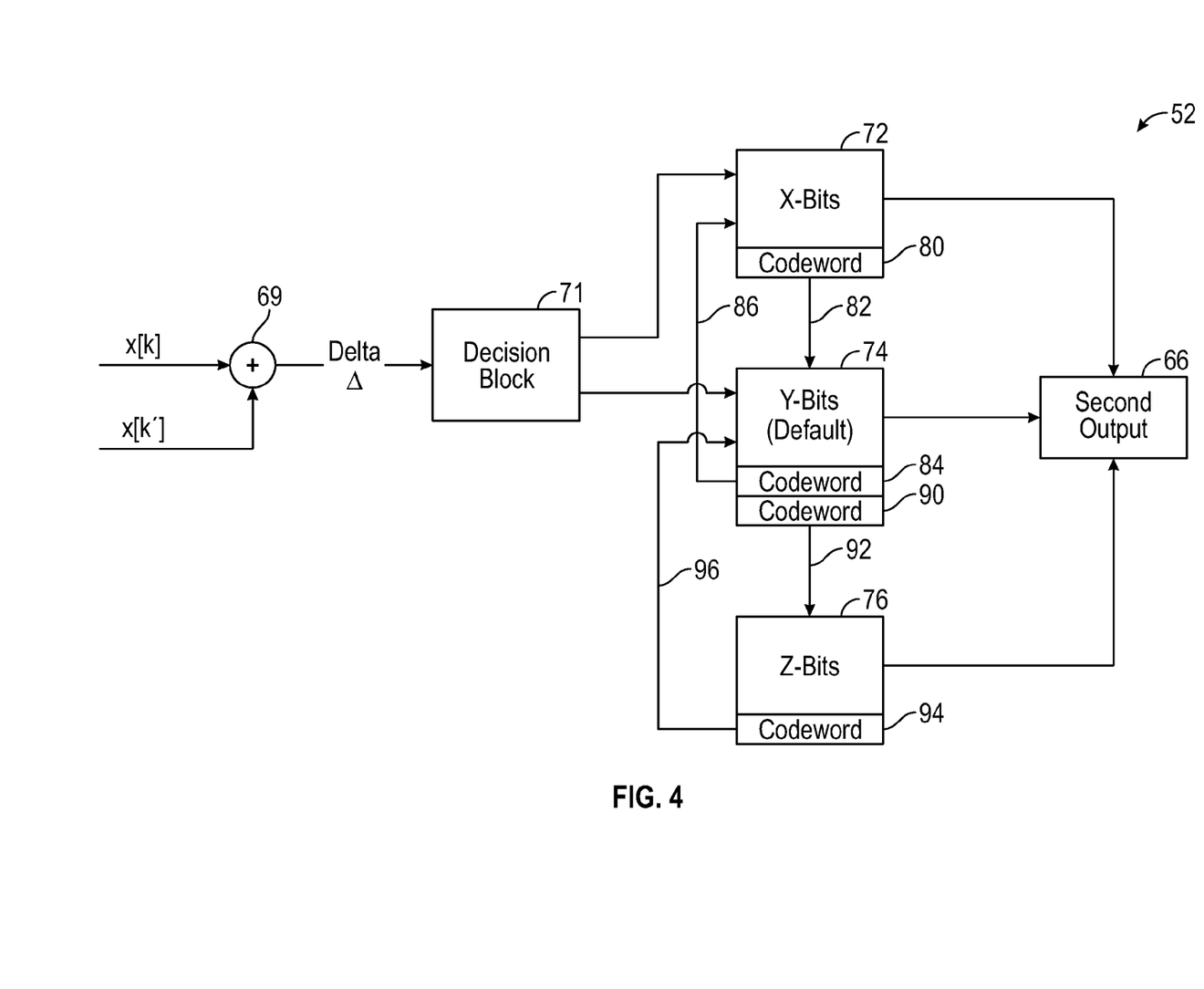
FIG. 4 is a block diagram of the second DPCM block shown in FIG. 2.

FIG. 4 is an illustration of the is a block diagram illustrating the second DPCM block 52. The second DPCM block 52 includes similar components as the first DPCM block 50. However, unlike the first DPCM block 50, subtraction block 69 receives as input the initial sample x[k] from the A/D converter 44 (FIG. 2) as well as the predicted sample x[k'] generated by the module 70 (FIG. 2). The decision block 70 may then determine a delta Δ between the initial sample x[k] and the predicted sample x[k']. The second DPCM block 52 may then use a similar process as described above and illustrated in FIG. 3 for generating the second output 66.

Turning back to FIG. 2, the encoder 40 may determine a final output 100 based on the first output 64 of the first DPCM block 50 and the second output 66 of the second DPCM block 52. Specifically, the first counter 54 and the second counter 56 may be set to a specific number n. The specific number n represents the number of samples that are stored in the respective buffers 58, 60. For example, if n=10, then the first counter 54 monitors the first buffer 58 to count the values of the first output 64 stored in the first buffer 54. The second counter 56 may also monitor the second buffer 60 to count the values of the second output 66 stored in the second buffer 60. Once n=10 values of the first output 64 are stored in the first buffer 58 and ten values of the second output 66 are stored in the second buffer 60, then the $n^{th}$ (e.g., $10^{th}$) value of the first output 64 and the second output 66 are both sent to the comparator 62. The comparator 62 may then determine if the number of bits of the $n^{th}$ (e.g., $10^{th}$) value of the first output 64 is greater than the number of bits of the of $n^{th}$ (e.g., $10^{th}$) value of the second output 66. For example, if the first output 64 is expressed in 4 bits and the second output 66 is expressed in 8 bits, the comparator 62 may select the first output 64 as the final output 100.

Referring generally to FIGS. 1-4, the disclosed hybrid data encoding system 10 utilizes two different DPCM techniques and adaptively chooses the output requiring the least amount of bits. It is to be understood that the disclosed hybrid data encoding system 10 results in an output that requires the fewest number of bits possible, which in turn results in a greater compression of data.

Figure 5:
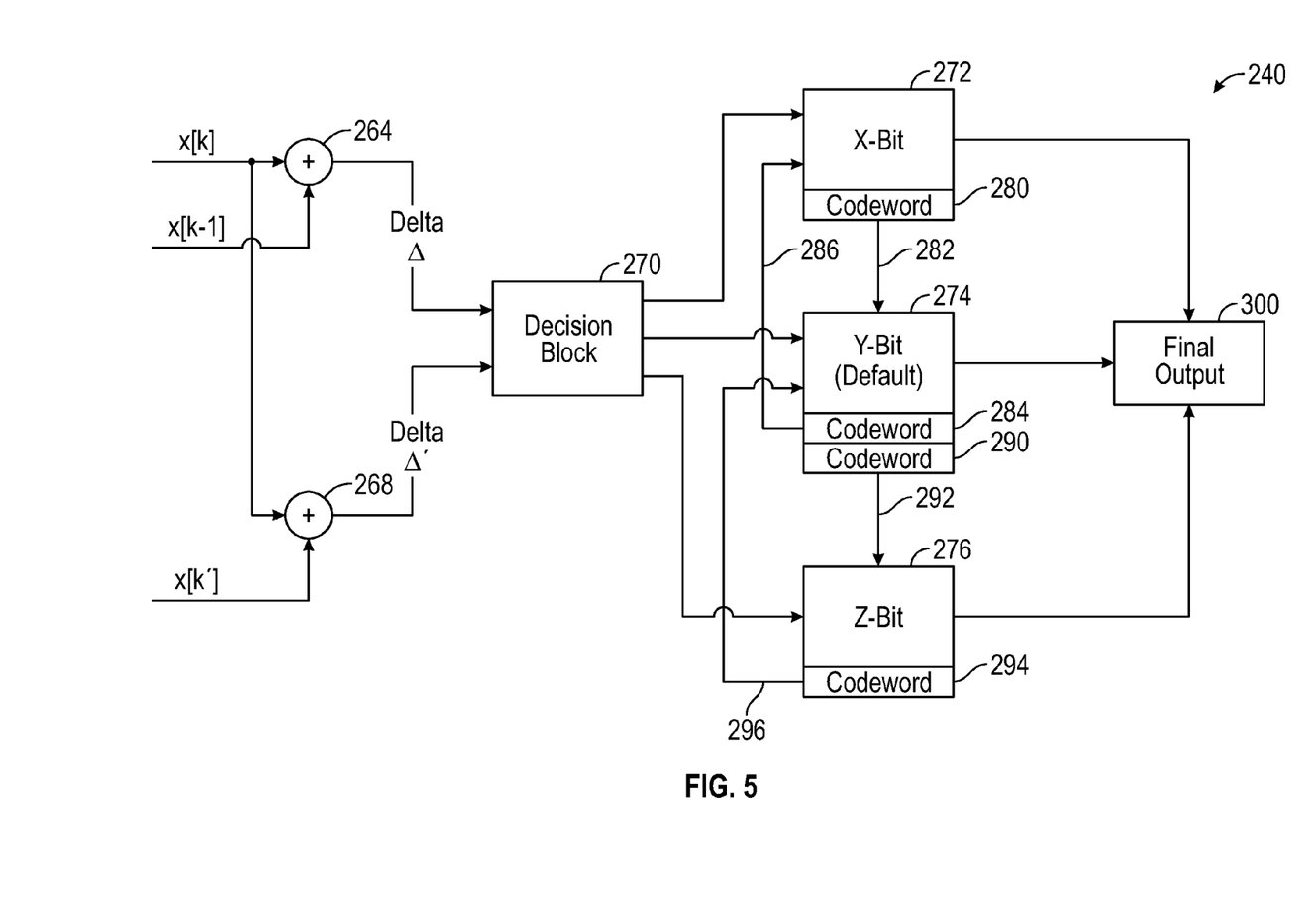
FIG. 5 is a block diagram of an alternative embodiment of the encoder based on a biased approach.

FIG. 5 is an alternative embodiment of an encoder 240 that utilizes a biased data encoding system instead of the hybrid approach as illustrated in FIGS. 2-4 that is described above. The encoder 240 includes a first subtraction block 264, a second subtraction block 268, a decision block 270, an X-bit block 272, an Y-bit block 274, and a Z-bit block 276. As explained in greater detail below, the biased data encoding system determines if a final output 300 of the encoder 240 may be based on a difference between the initial sample x[k] and the previous sample x[k−1] determined by the first subtraction 264, or, alternatively, if the final output 300 of the encoder may be based on a difference between the initial sample x[k] and the predicted sample x[k'] determined by the second subtraction block 268.

Similar to the embodiment as shown in FIG. 3, the Y-bit block 274 may represent a default number of bits (e.g., an 8-bit value), the X-bit block 272 may represent a bit value that is less than the default number of bits (e.g., 4-bit values), and the Z-bit block 276 may represent a bit value that is greater than the default number of bits (e.g., 10-bit values). The first subtraction block 264 receives as input the initial sample x[k] and the previous sample x[k−1] from the A/D converter 44 (FIG. 2). The first subtraction block 264 may then determine the delta Δ between the initial sample x[k] and the previous sample x[k−1]. Similar to the embodiment as shown in FIG. 3, in one embodiment the delta Δ is expressed as a 12 bit value. The delta Δ value is then sent to the decision block 270.

The decision block 270 may then determine if the delta Δ may be expressed in the default number of bits (e.g., an 8-bit value), or as a number of bits less than the default value (e.g., a 4-bit value). Specifically, during initial operation of the encoder 240, a first delta Δ1 may first be received by the decision block 270. The first delta Δ1 represents an initial or first difference determined by the first subtraction block 264. The first delta Δ1 may be, for example, a digital 12 bit value including a flag bit. The flag bit provides an indication as to whether the first delta Δ1 should be expressed in X bits or Y bits. If the flag bit indicates the first delta Δ1 should be expressed in an X number of bits, then the first delta Δ1 is sent to the X-bit block 272. The first delta Δ1 may then be expressed as the final output 300.

Alternatively, if the flag bit indicates the first delta Δ1 should be expressed in Y number of bits, then the first delta Δ1 is sent to the X-bit block 272 in the form of a first codeword 280. For example, the first delta Δ1 may be a numerical value that exceeds 4 bits (i.e., exceeds the range of −8 and +7). The first codeword 280 may be saved within the memory 34 of the electronic device 22 (FIG. 1), and provides an indication that the first delta Δ1 should be expressed as a Y bit value. In one exemplary embodiment, the first codeword 280 may be a binary value expressing the values −8, −7, or 7. It is to be understood that the decision block 270 does not provide the value of the first codeword 280 to the X-bit block 272, thus allowing either −6, −7, or 7 to be used as the codeword 280. The first codeword 280 indicates that the first delta Δ1 should be expressed as a Y bit value. Thus, a signal or indicator 282 is sent to the Y-bit block 274 by the X-bit block 272 containing the first delta Δ1. The first delta Δ1 may then be transmitted as the final output 300 of the encoder 240.

It should be appreciated that once the decision block 270 generates the first codeword 280, then the second subtraction block 268 may be used to determine a delta Δ' instead of the first subtraction block 264 determining the delta Δ. That is, the decision block 270 selects either the first subtraction block 264 or the second subtraction block 268 to determine the final output 300 based on if the first delta Δ1 should be expressed in a threshold number of bits. In the present example, the threshold number of bits is 4 bits, however those of ordinary skill in the art will appreciate that this number of threshold bits is merely exemplary in nature. Thus, in response to the decision block 270 determining the final output 300 should be expressed as a threshold number of bits (e.g., the X number of bits), the first subtraction block 264 determines the delta Δ based on a magnitude in difference between the initial sample x[k] and the previous sample x[k−1]. However, in response to the decision block 270 determining that the final output 300 should not be expressed in a threshold number of bits (i.e., the final output 300 exceeds X number of bits), the second subtraction block 268 determines the delta Δ' based on a magnitude in difference between the initial sample x[k] and the predicted sample x[k']. It is to be understood that the predicted sample x[k'] may be used to determine the delta Δ' because the probability of bit error decreases as the number of bits increases.

Similar to the delta Δ determined by the first subtraction block 264, in one embodiment the delta Δ' may also be expressed as a 12 bit value. The delta Δ' value may be sent to the decision block 270. The decision block 270 may then determine if the delta Δ' may continue to be expressed in the default number of bits (i.e., as the Y bit value). Specifically, if the delta Δ' may be expressed as the default number of bits, then the delta Δ' may then be transmitted as the final output 300 of the encoder 240 as a Y-bit value by the Y-bit block 274. However, during subsequent operation of the encoder 240, the second decision block 270 may determine that the delta Δ' may no longer be expressed in Y bits. Specifically, in one approach a second delta Δ2', which is generated subsequent to the delta Δ', may represent a numerical value that may be expressed in a fewer number of bits than the default value of Y bits. For example, the second delta Δ2' may be a numerical value that may actually be expressed in only X number of bits (e.g., the second delta Δ2' may be expressed as a 4-bit value instead of the default 8-bit value).

In response to determining that the second delta Δ2' represents a numerical value that may be expressed in a fewer number of bits than the default value of Y bits, the decision block 270 may then generate a second indicator or codeword 284. The second codeword 284 may be saved within the memory 34 of the electronic device 22 (FIG. 1). The second codeword 284 provides a signal or indicates that the second delta Δ2' should be expressed as an X-bit value. Thus, a signal or indicator 286 is sent to the X-bit block 272 by the Y-bit block 274 containing the second delta Δ2'. The second delta Δ2' may be transmitted as the final output 300 of the encoder 240 as an X-bit value by the X-bit block 272. Once the decision block 270 generates the second codeword 284, then the first subtraction block 264 may be used to determine a delta Δ instead of the second subtraction block 268 determining the delta Δ'.

In addition to the second codeword 284, a third codeword 290 may also be saved within the memory 34 of the electronic device 22 (FIG. 1). For example, in an alternative approach the second delta Δ2' may represent a numerical value that may be expressed in a greater number of bits than the default value. For example, the second delta Δ2' may be a numerical value that may actually be expressed in Z number of bits (i.e., the second delta Δ2' may be expressed as a 10-bit value instead of the default 8-bit value). In response to determining that the second delta Δ2' represents a numerical value that may be expressed in a greater number of bits, the decision block 270 may then generate the third codeword 290. The third codeword 290 indicates that the second delta Δ2' should be expressed as a Z-bit value. Thus, a signal or indicator 292 is sent to the Z-bit block 276 by the Y-bit block 274 containing the second delta Δ2'. The second delta Δ2' may then be transmitted as the final output 300 of the encoder 240 as a Z-bit value by the Z-bit block 276.

Continuing to refer to FIG. 5, during operation of the encoder 240, the delta Δ' may no longer be expressed in Z bits. Specifically, in one approach a third delta Δ3', which is generated subsequent to the second delta Δ2', may represent a numerical value that should be expressed in a fewer number of bits than the Z number of bits. For example, the third delta Δ3' may be a numerical value that may actually be expressed in only Y number of bits (i.e., the third delta Δ3' may be within the range of a 8-bit value). In response to determining that the third delta Δ3' represents a numerical value that may be expressed in a fewer number of bits than the Z number of bits, the decision block 270 may then generate the fourth codeword 294. The fourth codeword 294 may be saved within the memory 34 of the electronic device 22 (FIG. 1). The fourth codeword 294 provides a signal or indicates that the third delta Δ3' should be expressed as a different binary value. Specifically, the fourth codeword 294 indicates that third delta Δ3' should be expressed as an Y bit value. Thus, a signal or indicator 296 is sent to the Y-bit block 274 by the Z-bit block 276 containing the third delta Δ3'. The third delta Δ3' may be transmitted as the final output 300 of the encoder 240 as a Y-bit value by the Y-bit block 274.

Referring generally to FIGS. 1 and 5, the disclosed biased data encoding system utilizes two different DPCM techniques, and selects the specific DPCM technique based on whether the output may be expressed in a threshold number of bits. The disclosed biased data encoding system may reduce the bit error rate in the output 300, and may also losslessly compress data as well.

Figure 6:
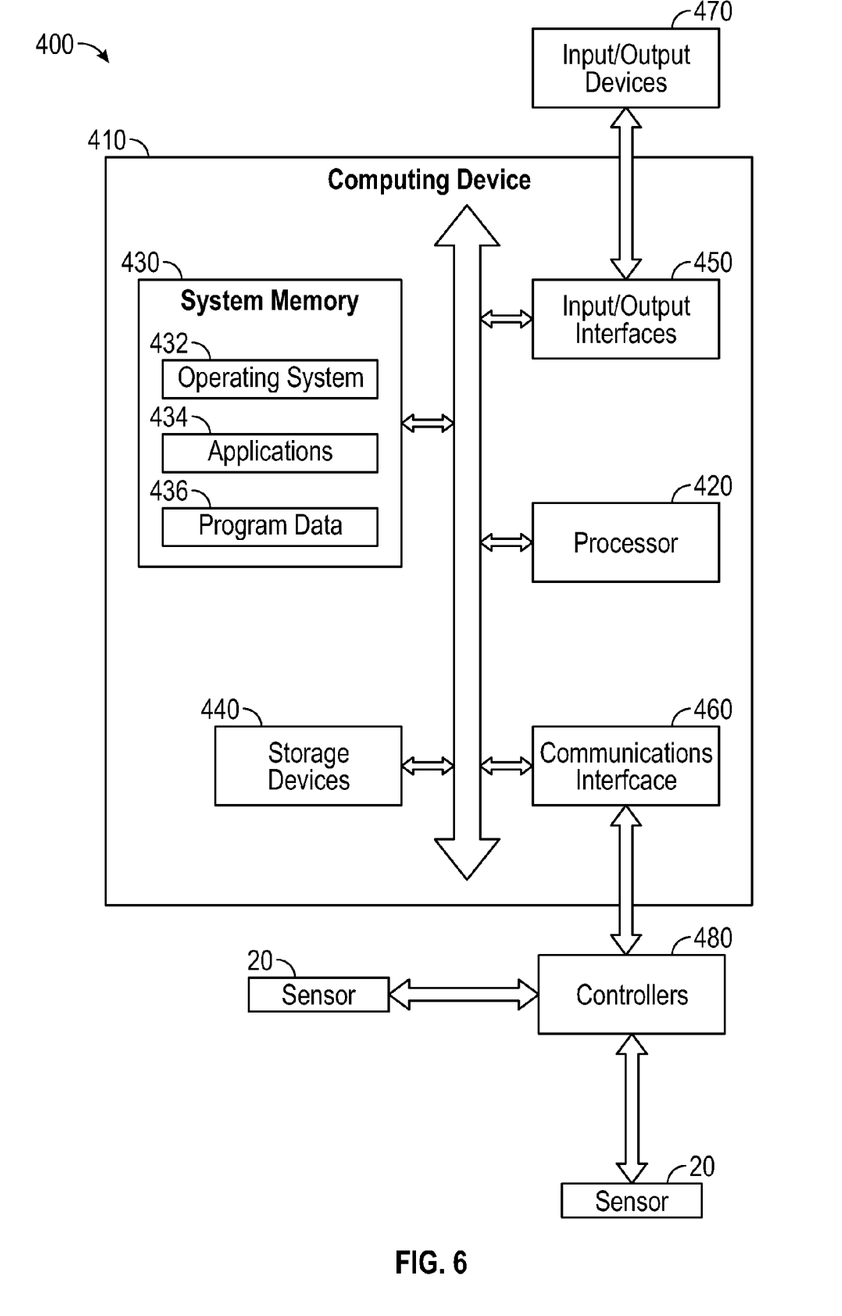
FIG. 6 is an illustration of a block diagram of an exemplary computing environment including a general purpose computing device for supporting embodiments of the present disclosure.

FIG. 6 is an illustration of a block diagram of a computing environment 400 including a general purpose computing device 410 for supporting embodiments of computer-implemented methods and computer-executable program instructions (or code) according to the present disclosure. For example, the computing device 410, or portions thereof, may execute instructions to adaptively encode/decode data in a particular number of bits. The computing device 410, or portions thereof, may further execute instructions according to any of the methods described herein.

The computing device 410 may include a processor 420. The processor 420 may communicate with a system memory 430, one or more storage devices 440, one or more input/output interfaces 450, one or more communications interfaces 460, or a combination thereof. The system memory 430 may include volatile memory devices (e.g., random access memory (RAM) devices), nonvolatile memory devices (e.g., read-only memory (ROM) devices, programmable read-only memory, and flash memory), or both. The system memory 430 may include an operating system 432, which may include a basic/input output system for booting the computing device 410 as well as a full operating system to enable the computing device 410 to interact with users, other programs, and other devices.

The system memory 430 may include one or more computer programs or applications 434 which may be executable by the processor 420. For example, the applications 434 may include instructions executable by the processor 420 to adaptively encode/decode data in a particular number of bits. The system memory 430 may include program data 436 usable for controlling the adaptive encoding/decoding of data. The applications 434 may also be embodied in a computer readable medium having the applications 434 stored therein.

The processor 420 may also communicate with one or more storage devices 440. For example, the one or more storage devices 460 may include nonvolatile storage devices, such as magnetic disks, optical disks, or flash memory devices. The storage devices 440 may include both removable and non-removable memory devices. The storage devices 440 may be configured to store an operating system, images of operating systems, applications, and program data. In a particular embodiment, the memory 430, the storage devices 440, or both, include tangible computer-readable media.

The processor 420 may also communicate with one or more input/output interfaces 450 that enable the computing device 410 to communicate with one or more input/output devices 470 to facilitate user interaction. The input/output interfaces 450 may include serial interfaces (e.g., universal serial bus (USB) interfaces or Institute of Electrical and Electronics Engineers (IEEE) 1394 interfaces), parallel interfaces, display adapters, audio adapters, and other interfaces. The input/output devices 470 may include keyboards, pointing devices, displays, speakers, microphones, touch screens, and other devices. The processor 420 may detect interaction events based on user input received via the input/output interfaces 450. Additionally, the processor 420 may send a display to a display device via the input/output interfaces 450.

The processor 420 may communicate with devices or controllers 480 via the one or more communications interfaces 460. The one or more communications interfaces 460 may include wired Ethernet interfaces, IEEE 802 wireless interfaces, other wireless communication interfaces, or other network interfaces. The devices or controllers 480 may include host computers, servers, workstations, and other computing devices. FIG. 6 further illustrates that the devices or controllers 480 may be communicatively coupled to one or more sensors 20 (e.g., temperature sensors, pressure sensors, etc.).

While the forms of apparatus and methods herein described constitute preferred aspects of this disclosure, it is to be understood that the disclosure is not limited to these precise forms of apparatus and methods, and the changes may be made therein without departing from the scope of the disclosure.

What is claimed is:

1. A system for decoding data based on a hybrid approach, comprising:
  a processor; and
  a memory storing instructions that are executable by the processor to perform operations comprising:
    determining a first output based on a magnitude in difference between an initial sample and a previous sample, wherein the first output includes a first number of bits;
    determining a second output based on a magnitude in difference between the initial sample and a predicted sample, wherein the second output includes a second number of bits;
    comparing the first output with the second output to determine if the first number of bits is greater than the second number of bits; and
    selecting one of the first output and the second output as the final output, wherein selection is based on the final output being expressed in the least number of bits.

2. The system as recited in claim 1, comprising at least one codeword stored in the memory, wherein the at least one codeword indicates that the first output should be expressed as either a greater number of bits or a fewer number of bits than the first number of bits.

3. The system as recited in claim 1, comprising at least one codeword stored in the memory, wherein the at least one codeword indicates that the second output should be expressed as either a greater number of bits or a fewer number of bits than the second number of bits.

4. The system as recited in claim 1, comprising at least one sensor that generates an analog signal that is converted into the initial sample.

5. The system as recited in claim 4, wherein the analog signal represents one of temperature and pressure.

6. The system as recited in claim 4, comprising an analog to digital (A/D) converter that quantizes the analog sample into the initial sample.

7. The system as recited in claim 1, wherein the final output is expressed as one of a 4-bit, 8-bit, and a 10-bit value.

8. The system as recited in claim 1, comprising a first buffer and a first counter, wherein the first counter monitors the first buffer and counts a number of times the first output is stored in the first buffer.

9. The system as recited in claim 8, comprising a second buffer and a second counter, wherein the second counter monitors the second buffer and counts a number of times the second output is stored in the second buffer.

10. The system as recited in claim 9, comprising a comparator that receives an $n^{th}$ value of both the first output and the second output.

11. The system as recited in claim 10, wherein the comparator determines if the first number of bits of the $n^{th}$ value of the first output is greater than the second number of bits of the $n^{th}$ value of the second output.

12. A system for decoding data based on a biased approach, comprising:
  a processor; and
  a memory storing instructions that are executable by the processor to perform operations comprising:
    determining if a final output is expressed as a threshold number of bits;
    determining the final output based on a magnitude in difference between an initial sample and a previous sample in response to the final output being expressed as the threshold number of bits; and
    determining the final output based on a magnitude in difference between the initial sample and a predicted sample in response to the final output being expressed as a number of bits that exceed the threshold number of bits.

13. The system as recited in claim 12, comprising at least one codeword stored in the memory, wherein the at least one codeword indicates that the final output should be expressed as either a greater number of bits or a fewer number of bits.

14. The system as recited in claim 12, comprising at least one sensor that generates an analog signal that is converted into the initial sample.

15. The system as recited in claim 14, wherein the analog signal represents one of temperature and pressure.

16. The system as recited in claim 14, comprising an analog to digital (A/D) converter that quantizes the analog sample into the initial sample.

17. The system as recited in claim 12, wherein the final output is expressed as one of a 4-bit, 8-bit, and a 10-bit value.

18. A non-transitory computer readable medium for decoding data based on a hybrid approach, the computer readable medium comprising a computer program that when executed by a computer, causes the computer to:
  determine a first output based on a magnitude in difference between an initial sample and a previous sample, wherein the first output includes a first number of bits;
  determine a second output based on a magnitude in difference between the first sample and a predicted sample, wherein the second output includes a second number of bits;
  compare the first output with the second output to determine if the first number of bits is greater than the second number of bits; and
  select one of the first output and the second output as the final output, wherein selection is based on the final output being expressed in the least number of bits.

19. The computer readable medium of claim 18, wherein the computer is further caused to express the final output as one of a 4-bit, 8-bit, and a 10-bit value.

20. The computer readable medium of claim 18, wherein the computer is further caused to quantize the analog sample into the first sample.

\* \* \* \* \*